United States Patent
Havemann

(10) Patent No.: US 7,368,401 B2
(45) Date of Patent: May 6, 2008

(54) INTEGRATED CIRCUIT HAVING A DOPED POROUS DIELECTRIC AND METHOD OF MANUFACTURING THE SAME

(75) Inventor: Robert H. Havemann, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/844,984

(22) Filed: May 13, 2004

(65) Prior Publication Data

US 2004/0211991 A1    Oct. 28, 2004

Related U.S. Application Data

(62) Division of application No. 10/001,472, filed on Nov. 1, 2001, now Pat. No. 6,753,563.

(60) Provisional application No. 60/251,494, filed on Dec. 5, 2000.

(51) Int. Cl.
*H01L 29/72* (2006.01)

(52) U.S. Cl. .................. 438/783; 438/235; 438/296; 438/398; 438/787

(58) Field of Classification Search ........... 438/218, 438/249, 542, 558, 783, 787, 235, 296, 398
See application file for complete search history.

(56) References Cited

U.S. PATENT DOCUMENTS

| 5,728,618 | A | 3/1998 | Tseng |
| 6,255,156 | B1* | 7/2001 | Forbes et al. ............ 438/235 |
| 6,316,833 | B1 | 11/2001 | Oda |
| 6,511,923 | B1* | 1/2003 | Wang et al. ............. 438/783 |
| 6,583,071 | B1* | 6/2003 | Barnes et al. ........... 438/787 |
| 2001/0055725 | A1* | 12/2001 | Hussein et al. ........ 430/270.1 |
| 2004/0130029 | A1* | 7/2004 | Raaijmakers et al. ..... 257/758 |
| 2004/0227247 | A1* | 11/2004 | Chooi et al. ............ 257/758 |

* cited by examiner

*Primary Examiner*—Edward Wojciechowicz
(74) *Attorney, Agent, or Firm*—Jacqueline J. Garner; W. James Brady, III; Frederick J. Telecky, Jr.

(57) ABSTRACT

In one aspect of the invention, a method for forming an integrated circuit having an at least substantially doped porous dielectric includes forming a semiconductor device. The semiconductor device includes at least a portion of a semiconductor substrate. The method also includes forming a dielectric layer disposed outwardly from the semiconductor substrate and surrounding at least a portion of the semiconductor device. The dielectric layer includes an at least substantially porous dielectric material doped with at least one dopant. In addition, the method includes forming a contact layer disposed outwardly from the dielectric layer and operable to provide electrical connection to the semiconductor device.

11 Claims, 3 Drawing Sheets

INTEGRATED CIRCUIT HAVING A DOPED POROUS DIELECTRIC AND METHOD OF MANUFACTURING THE SAME

This is a divisional application of Ser. No. 10/001,472 filed Nov. 1, 2001 now U.S. Pat. 6,753,563 which is a non-provisional application of provisional application Ser. No. 60/251,494 filed Dec. 5, 2000.

TECHNICAL FIELD OF THE INVENTION

This invention relates to the field of electronic devices, and more particularly to an intergrated circuit having a doped porous dielectric and method of manufacturing the same.

BACKGROUND OF THE INVENTION

Integrated circuits typically contain a large number of semiconductor devices. Manufacturers of the integrated circuits often wish to decrease the size of the integrated circuits, which allows more circuitry to be placed within the same physical area of a circuit. To help decrease the size of the integrated circuits, the manufacturers may place the semiconductor devices closer together in the integrated circuits. One problem is that capacitance between the semiconductor devices typically increases as the space between the semiconductor devices decreases. The increased capacitance between the semiconductor devices can interfere with the operation of the semiconductor devices and with the operation of the integrated circuits.

One approach to decreasing the capacitance between the semiconductor devices involves decreasing the thickness of the semiconductor devices. For example, the manufacturers may reduce the thickness of gates used in transistors. The capacitance between the semiconductor devices is typically proportional to the cross-sectional area of the semiconductor devices. Because thinner semiconductor devices have less cross-sectional area, the capacitance between the semiconductor devices typically decreases. A problem with this approach is that difficulty may be encountered in maintaining the operation of the semiconductor devices. As the semiconductor devices become thinner, the reduced size of the devices may interfere with the ability of the devices to conduct. Eventually, the reduced thickness of the semiconductor devices may prevent the devices from conducting, and the semiconductor devices in the integrated circuits can fail.

Another approach to decreasing the capacitance between the semiconductor devices involves lowering the dielectric constant (K) of the insulating material between the devices. For example, oxide may be used as an insulating material in an integrated circuit, and oxide typically has a dielectric constant of approximately four. The capacitance between the semiconductor devices is typically proportional to the dielectric constant of the insulating material. As a result, lowering the dielectric constant of the insulating material reduces the capacitance between the semiconductor devices. A problem with this approach is that, as manufacturers place the semiconductor devices closer together, the dielectric constant of the insulating material may still be high enough to allow the formation of an appreciable amount of capacitance in the integrated circuit. Also, the insulating material may suffer from contamination, such as by metal ions like sodium, that interferes with the operation of the integrated circuit.

SUMMARY OF THE INVENTION

The present invention recognizes a need for an improved integrated circuit having a doped porous dielectric and method of manufacturing the same. The present invention reduces or eliminates at least some of the shortcomings of prior systems and methods.

In one embodiment of the invention, an integrated circuit includes a semiconductor device. The integrated circuit also includes a contact layer disposed outwardly from the semiconductor device and operable to provide electrical connection to the semiconductor device. In addition, the integrated circuit includes a dielectric layer disposed inwardly from the contact layer and outwardly from the semiconductor device. The dielectric layer comprises an at least substantially porous dielectric material doped with at least one dopant.

In a particular embodiment of the invention, the semiconductor device comprises a transistor. Also, the dielectric layer may, for example, include an at least substantially porous dielectric material doped with at least one of phosphorus, fluorine, carbon, and boron.

In another embodiment of the invention, a method for forming an integrated circuit having an at least substantially doped porous dielectric includes forming a semiconductor device. The semiconductor device comprises at least a portion of a semiconductor substrate. The method also includes forming a dielectric layer disposed outwardly from the semiconductor substrate and surrounding at least a portion of the semiconductor device. The dielectric layer comprises an at least substantially porous dielectric material doped with at least one dopant. In addition, the method includes forming a contact layer disposed outwardly from the dielectric layer and operable to provide electrical connection to the semiconductor device.

Numerous technical advantages can be gained through various embodiments of the invention. Various embodiments of the invention may exhibit none, some, or all of the following advantages. For example, in one embodiment of the invention, an integrated circuit is provided that uses a doped, at least substantially porous dielectric material disposed between a semiconductor device and a contact layer. The dielectric material may be doped with any suitable dopant material, such as phosphorus and fluorine. The use of a fluorine dopant decreases the dielectric constant of the dielectric material, which helps to reduce the capacitance between different conductive regions in the integrated circuit. The use of phosphorus reduces the effects of metallic contamination in the dielectric material, which helps to reduce or eliminate interference caused by the contaminant in the integrated circuit.

Another technical advantage of at least some embodiments of the invention is that the conductive regions in the semiconductor device retain an appropriate amount of thickness, helping to ensure that the integrated circuit operates properly. The conductive regions in the semiconductor device may retain enough thickness to conduct properly, which helps to ensure that the semiconductor device operates properly. The conductive regions need not be reduced in size to the point where it interferes with the ability of the integrated circuit to function.

Other technical advantages are readily apparent to one of skill in the art from the attached figures, description, and claims.

BRIEF DESCRIPTION OF THE DRAWINGS

For a more complete understanding of the present invention and the advantages thereof, reference is now made to the following descriptions taken in connection with the accompanying drawings, in which.

DETAILED DESCRIPTION OF THE INVENTION

Figure 1:
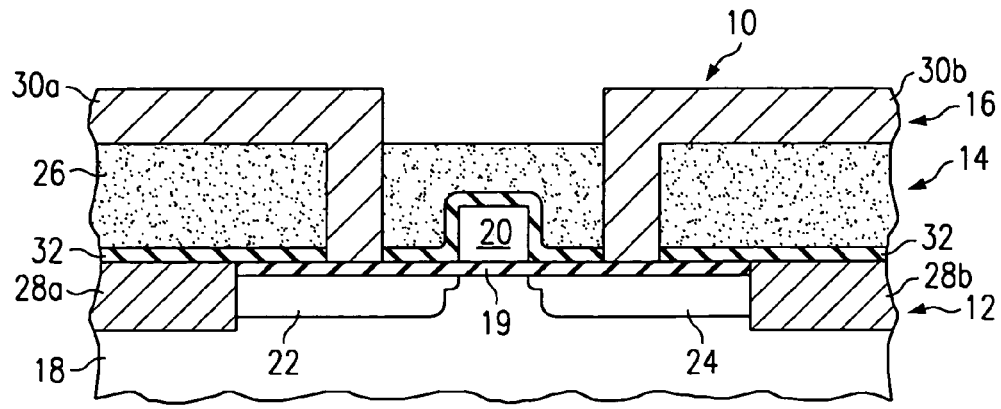
FIG. 1 is a cross-sectional view of an exemplary integrated circuit constructed according to the teachings of the present invention.

FIG. 1 is a cross-sectional view of an exemplary integrated circuit 10 constructed according to the teachings of the present invention. In the illustrated embodiment, integrated circuit 10 includes a semiconductor device 12, a dielectric layer 14 disposed outwardly from semiconductor device 12, and a contact layer 16 disposed outwardly from semiconductor device 12 and/or dielectric layer 14. Other embodiments of integrated circuit 10 may be used without departing from the scope of the present invention.

In one aspect of the invention, dielectric layer 14 comprises an at least substantially porous dielectric material 26. The dielectric material 26 in dielectric layer 14 may be doped with at least one dopant. The dopants may include any suitable doping materials, such as at least one of phosphorus, fluorine, carbon, and boron. Fluorine may be useful, for example, in reducing the dielectric constant of the dielectric material 26 in layer 14. Phosphorus may be useful, for example, in reducing or eliminating the effects of contamination of the dielectric material 26 in dielectric layer 14.

In the illustrated embodiment, semiconductor device 12 comprises a transistor having a transistor gate 20 formed outwardly from a semiconductor substrate 18. A gate dielectric 19 may be formed outwardly from semiconductor substrate 18 and inwardly from transistor gate 20. Other semiconductor devices 12 may be used in integrated circuit 10 without departing from the scope of the present invention. In this document, the phrase "semiconductor device" includes any structure or structures formed integral with and/or outwardly from a semiconductor substrate 18. Semiconductor device 12 could, for example, include any structure operable to perform various signal processing functions, such as switching, gain introduction, attenuation, memory storage, and/or other processing functions.

Semiconductor substrate 18 may comprise any suitable semiconductor substrate material, such as silicon. In the illustrated embodiment, semiconductor substrate 18 includes a source region 22 and a drain region 24.

Gate dielectric 19 is disposed outwardly from semiconductor substrate 18. Gate dielectric 19 may be formed using any suitable material or materials, such as silicon dioxide or silicate, and may comprise one or multiple layers.

Transistor gate 20 is disposed outwardly from semiconductor substrate 18 and/or gate dielectric 19. When transistor gate 20 receives a threshold voltage, transistor gate 20 operates in an "on" state and conducts between source region 22 and drain region 24. When transistor gate 20 receives less than a threshold voltage, transistor gate 20 operates in an "off" state and does not conduct between source region 22 and drain region 24. Transistor gate 20 may be formed using any suitable material or materials, such as polysilicon or metal, and may comprise one or multiple layers.

In the illustrated embodiment, semiconductor device 12 also includes two insulators 28a and 28b. In this embodiment, insulators 28 isolate source region 22 and drain region 24 from other portions of semiconductor substrate 18. For example, in one embodiment, multiple semiconductor devices 12 may be formed in integrated circuit 10, each having a source region 22 and a drain region 24. Insulators 28 may isolate the source region 22 and drain region 24 of one transistor from other source regions 22 and drain regions 24 of other transistors. Also, insulators 28 may define the area where source region 22 and drain region 24 are formed during fabrication. For example, when source region 22 and drain region 24 are being formed, insulators 28 may limit the area of semiconductor substrate 18 in which the regions 22 and 24 are formed. Insulators 28 may comprise any suitable material or materials operable to isolate source region 22 and drain region 24 from other portions of semiconductor substrate 18. In one embodiment, insulators 28 comprise oxidized regions of semiconductor substrate 18.

Contact layer 16 is disposed outwardly from semiconductor substrate 18. Contact layer 16 provides electrical connection to the semiconductor device 12. In the illustrated embodiment, contact layer 16 includes a first contact 30a and a second contact 30b. First contact 30a is disposed proximate to source region 22, and second contact 30b is disposed proximate to drain region 24. Other embodiments of contact layer 16 may be used without departing from the scope of the present invention. For example, in another embodiment, contact layer 16 comprises short-length local interconnects.

Contacts 30 may be formed from any conductive material or combination of conductive materials, such as copper, aluminum, tungsten, and/or doped polysilicon, and may comprise one or multiple layers. In one embodiment, to prevent contamination of other components of integrated circuit 10, each contact 30 may also comprise a barrier separating the conductive materials in contact 30 from dielectric layer 14. This may be useful, for example, in preventing copper contamination of the dielectric layer 14. In a particular embodiment, contacts 30 are separated from dielectric material 26 by a tantalum nitride barrier. Other embodiments of contacts 30 may be used without departing from the scope of the present invention.

Dielectric layer 14 is disposed outwardly from semiconductor device 12 and inwardly from contact layer 16. In one embodiment, dielectric layer 14 comprises an at least substantially porous dielectric material 26. Dielectric layer 14 may, for example, comprise one or multiple layers of an at least substantially porous oxide, such as XLK spin-on dielectric of DOW CORNING CORPORATION, or NANOGLASS-E of HONEYWELL MICROELECTRONICS MATERIALS. Dielectric layer 14 may also comprise an at least substantially porous organic dielectric material 26, such as porous SILK semiconductor dielectric resin of DOW CHEMICAL COMPANY, or FLARE advanced organic spin-on polymer of HONEYWELL MICROELECTRONIC MATERIALS. Dielectric layer 14 may comprise any other suitable dielectric material 26 or combination of dielectric materials 26, and may comprise one or multiple layers.

In one embodiment, dielectric layer 14 is doped with at least one dopant. Dielectric layer 14 may be doped with any suitable dopant material, such as at least one of phosphorus, fluorine, carbon, and boron. The use of a fluorine dopant helps to decrease the dielectric constant of the dielectric material 26, which helps to reduce the capacitance between different conductive regions in integrated circuit 10. The use of phosphorus helps to reduce the effects of metallic contamination, such as by sodium, in the dielectric material 26, which helps to reduce or eliminate interference caused by the contaminant.

In the illustrated embodiment, integrated circuit 10 also includes a nitride layer 32. Nitride layer 32 is useful, for example, in reducing or eliminating damage to semiconductor substrate 18 during the formation of contacts 30 and providing additional protection from contaminants.

Although FIG. 1 illustrates one embodiment of integrated circuit 10, other embodiments may be used without departing from the scope of the present invention. For example, integrated circuit 10 could include any type of semiconductor device 12 and any number of semiconductor devices 12. Also, semiconductor device 12 could be formed without the use of insulators 28. In addition, integrated circuit 10 could be formed without the use of nitride layer 32. Further, gate dielectric 19 may be removed during the fabrication of semiconductor device 12.

FIGS. 2a-2i illustrate an exemplary series of steps in the formation of an integrated circuit 110 constructed according to the teachings of the present invention. Integrated circuit 110 includes a semiconductor device 112, which in the illustrated embodiment comprises a transistor. Other embodiments of integrated circuit 110 may be used without departing from the scope of the present invention. For example, integrated circuit 110 could include any type of semiconductor device 112 and any number of semiconductor devices 112.

Figure 2A:
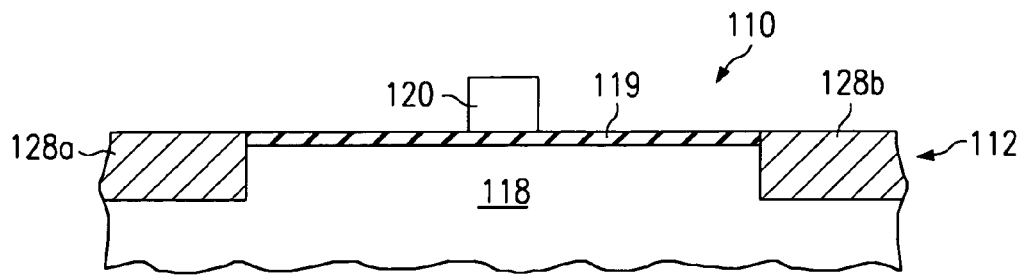
FIGS. 2a-2i illustrate an exemplary series of steps in the formation of an integrated circuit constructed according to the teachings of the present invention.

In FIG. 2a, a gate dielectric 119 and a transistor gate 120 are formed outwardly from a semiconductor substrate 118. This may include, for example, forming one or more layers of a nonconductive material or materials, such as silicon dioxide or silicate, outwardly from semiconductor substrate 118. This may also include depositing one or more layers of a conductive material or materials, such as polysilicon or metal, outwardly from semiconductor substrate 118. This may further include forming transistor gate 120 from the deposited conductive material, such as by using a pattern and etch.

Figure 2B:
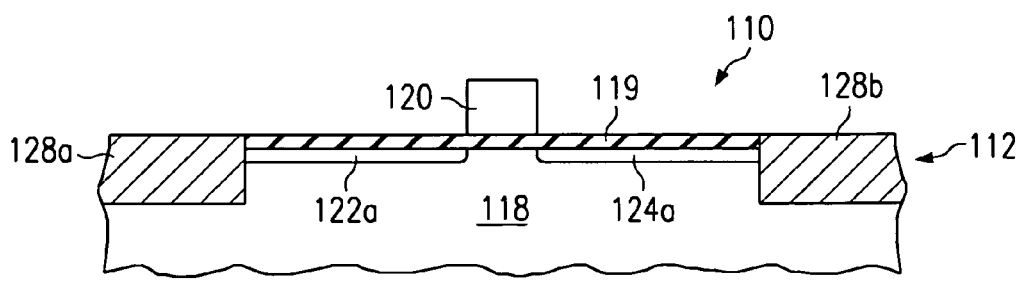

In FIG. 2b, shallow and lightly doped source region 122a and drain region 124a are formed in semiconductor substrate 118. This may include, for example, forming the shallow, lightly doped source region 122a and drain region 124a using any suitable fabrication method, such as diffusion or ion implantation. In one embodiment, a sidewall oxide, nitride, or other suitable material or materials may be deposited on transistor gate 120 to help offset source region 122a and drain region 124a from gate 120.

In the illustrated embodiment, semiconductor device 112 includes two insulators 128a and 128b. Insulators 128 help to isolate source region 122a and drain region 124a from other portions of semiconductor substrate 118. This may include isolating source region 122a and drain region 124a from source and drain regions of other semiconductor devices 112. Insulators 128 also help to control the area in which source region 122a and drain region 124a are formed during the fabrication of semiconductor device 112. In another embodiment, source region 122a and drain region 124a may be formed without the use of insulators 128.

Figure 2C:
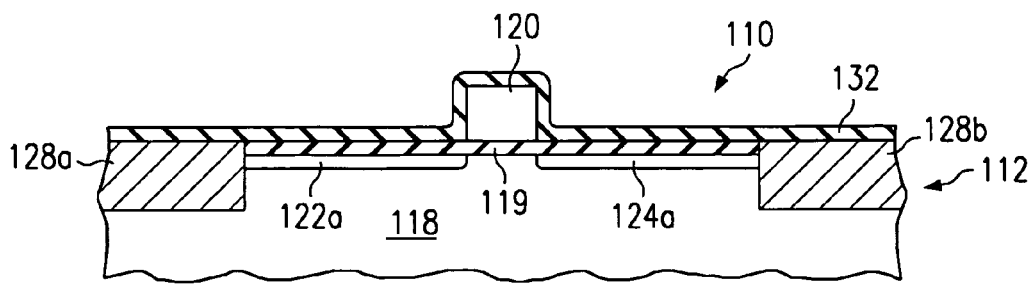
Figure 2D:
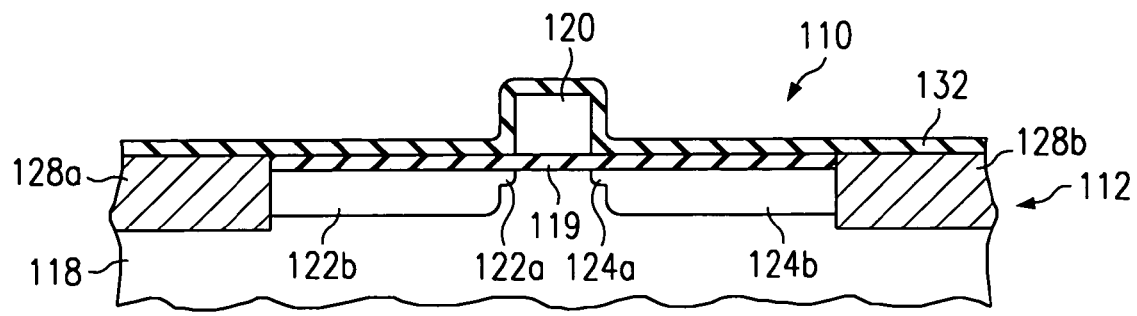

In FIG. 2c, a nitride layer 132 is formed outwardly from semiconductor device 112. Nitride layer 132 provides an offset between transistor gate 120 and deeper, more heavily doped source and drain regions in semiconductor substrate 118, which are illustrated in FIG. 2d. Nitride layer 132 may also be useful in reducing or eliminating damage to semiconductor substrate 118 during later fabrication steps. Nitride layer 132 may further be useful in protecting semiconductor device 112 from contaminants. Nitride layer 132 may be formed using any suitable method, such as low-pressure chemical vapor deposition. Although FIG. 2c shows nitride layer 132 covering semiconductor device 112, nitride layer 132 could also cover a portion of semiconductor device 112. In another embodiment, integrated circuit 110 may be formed without the use of nitride layer 132.

In FIG. 2d, deeper and more heavily doped source region 122b and drain region 124b are formed in semiconductor substrate 118. This may include, for example, forming the deeper, more heavily doped source region 122b and drain region 124b using any suitable fabrication method, such as diffusion or ion implantation. Nitride layer 132 may offset the source region 122b and drain region 124b from transistor gate 120. Insulators 128 also help to isolate source region 122b and drain region 124b from other portions of semiconductor substrate 118. In the remainder of this description, source regions 122a and 122b may be identified collectively as source region 122, and drain regions 124a and 124b may be identified collectively as drain region 124.

Figure 2E:
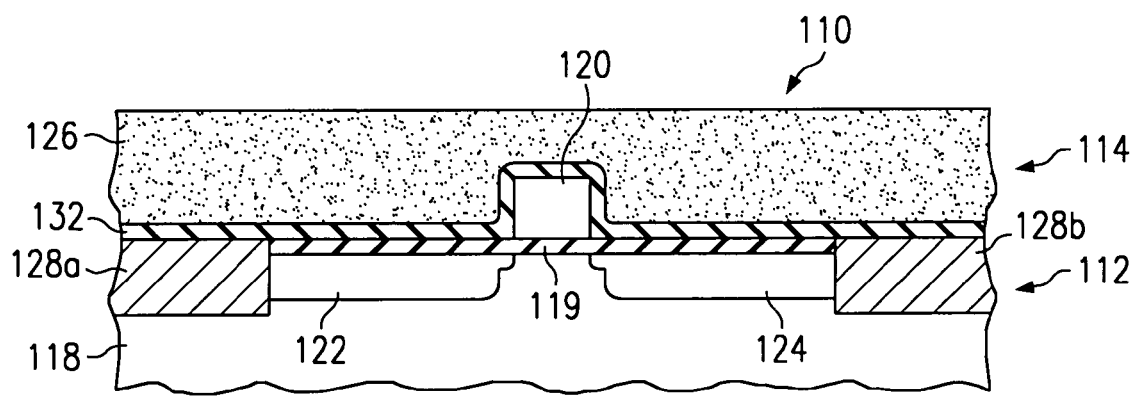

In FIG. 2e, a dielectric layer 114 is formed outwardly from semiconductor substrate 118. Dielectric layer 114 includes one or more at least substantially porous dielectric materials 126. Dielectric layer 114 may also include one or multiple layers of dielectric material or materials 126.

Dielectric layer 114 may be formed using any suitable fabrication method. In one embodiment, dielectric layer 114 is formed using a spin-on fabrication method by depositing a liquid precursor containing the dielectric material 126 on integrated circuit 110. Dielectric layer 114 could also be formed using a chemical vapor deposition method by placing integrated circuit 110 in a chamber containing at least one gas, where energy is applied to promote chemical reactions that form dielectric material 126.

Figure 2F:
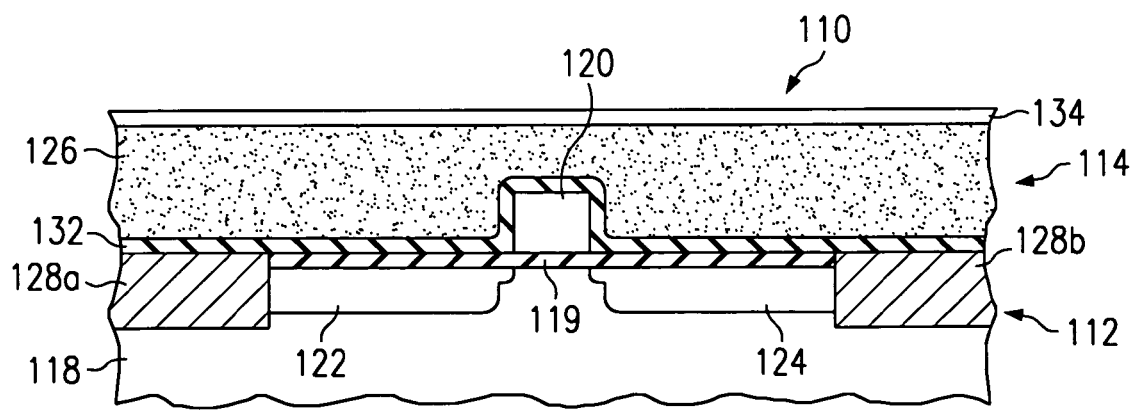

In FIG. 2f, one or more doping layers 134 are disposed outwardly from dielectric layer 114. Doping layer 134 contains at least one dopant. Doping layer 134 may, for example, comprise fluorine silicon glass or phosphorus silicon glass. Doping layer 134 may be formed using any suitable method, such as spin-on or chemical vapor deposition techniques.

After forming doping layer 134, doping layer 134 and dielectric layer 114 are annealed at one or more temperatures. By annealing the doping layer 134 and the dielectric layer 114, dielectric layer 114 may be doped with the dopant contained in the doping layer 134. In one embodiment, dielectric layer 114 is doped using a two-step anneal. In a particular embodiment, at least one doping layer 134 contains a phosphorus dopant. The integrated circuit 110 is annealed at one temperature to dope the dielectric layer 114 with the phosphorus dopant contained in doping layer 134. If needed, the dielectric layer 114 may then be annealed again to activate the phosphorus.

Although FIG. 2f illustrates one doping layer 134 disposed outwardly from dielectric layer 114, multiple doping layers 134 may be used without departing from the scope of the present invention. For example, two doping layers 134, one containing a phosphorus dopant and one containing a fluorine dopant, may be used to dope dielectric layer 114. Also, after annealing the doping layer 134, doping layer 134 may or may not be removed from the integrated circuit 110.

Figure 2G:
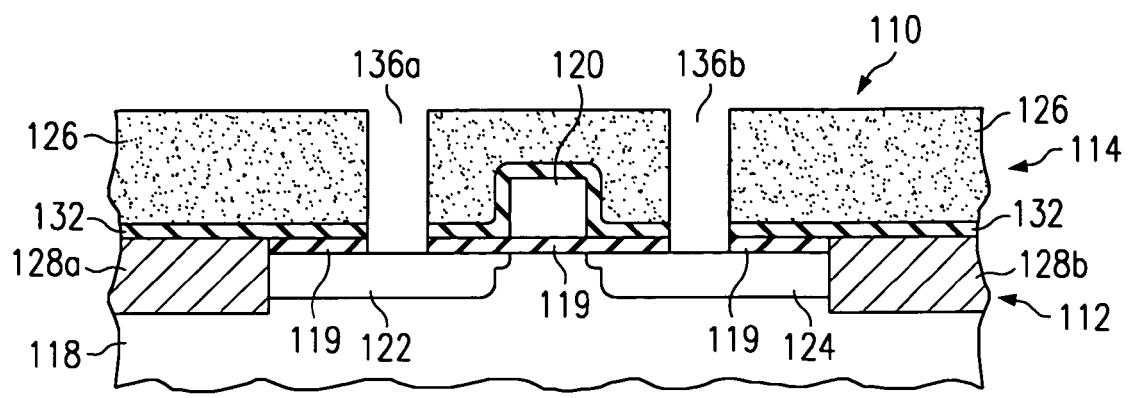

In FIG. 2g, cavities 136a and 136b are formed in dielectric layer 114, nitride layer 132, and gate dielectric 119. Cavities 136 may be formed using any suitable fabrication process, such as a pattern and etch. In the illustrated embodiment, cavities 136 are formed to approximately conform to the shape of contacts 130. In another embodiment, cavities 136 may be formed to approximately conform to other shapes, such as the shape of short-length local interconnects.

In one embodiment, at least two etches are used to form cavities 136. A first etch is used to form cavities 136 in the dielectric material 126 in dielectric layer 114. The first etch forms cavities 136 through dielectric material 126 until it reaches nitride layer 132. After that, a second etch, such as a nitride etch, is used to etch through nitride layer 132. This may help to reduce or eliminate damage to semiconductor substrate 118 during the etching process. In another embodiment, at least one other etch may also be used to etch through one or more doping layers 134 shown in FIG. 2f and/or gate dielectric 119.

Figure 2H:
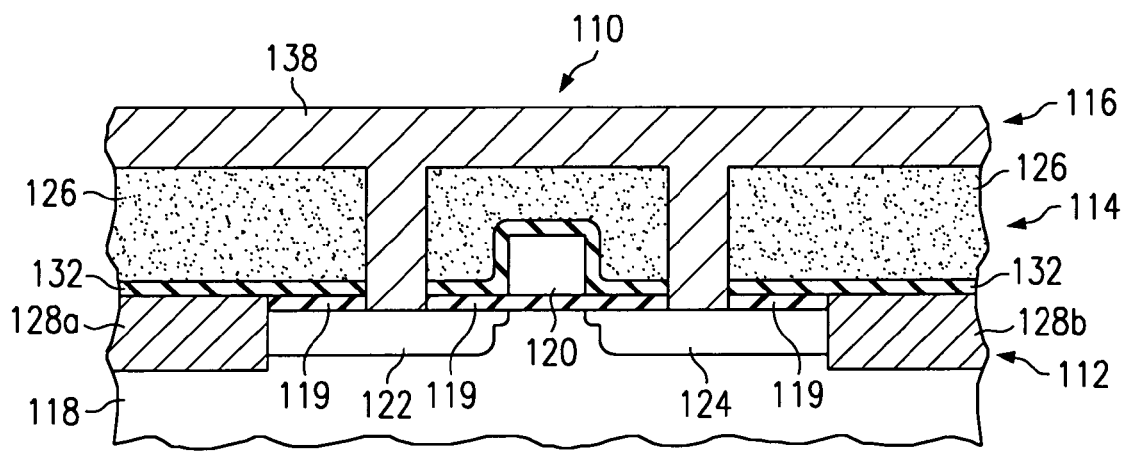

In FIG. 2h, a conductive material 138 is disposed outwardly from semiconductor substrate 118 in cavities 136. Conductive material 138 may be deposited on integrated circuit 110 using any suitable method, such as physical vapor deposition, chemical vapor deposition, or electrochemical deposition techniques. Conductive material 138 may comprise any conductive material or combination of conductive materials, including aluminum, tungsten, copper, and/or doped polysilicon. Conductive material 138 may further have one or multiple layers of conductive material or materials 138.

In one embodiment, conductive material 138 comprises copper. To prevent copper contamination of other components of integrated circuit 110, a barrier is formed between conductive material 138 and dielectric material 126. The barrier may be formed, for example, before the conductive material 138 is deposited on integrated circuit 110. The barrier helps to reduce or eliminate the contamination of the dielectric material 126 by the copper. In one embodiment, the barrier comprises a tantalum nitride barrier.

Figure 2I:
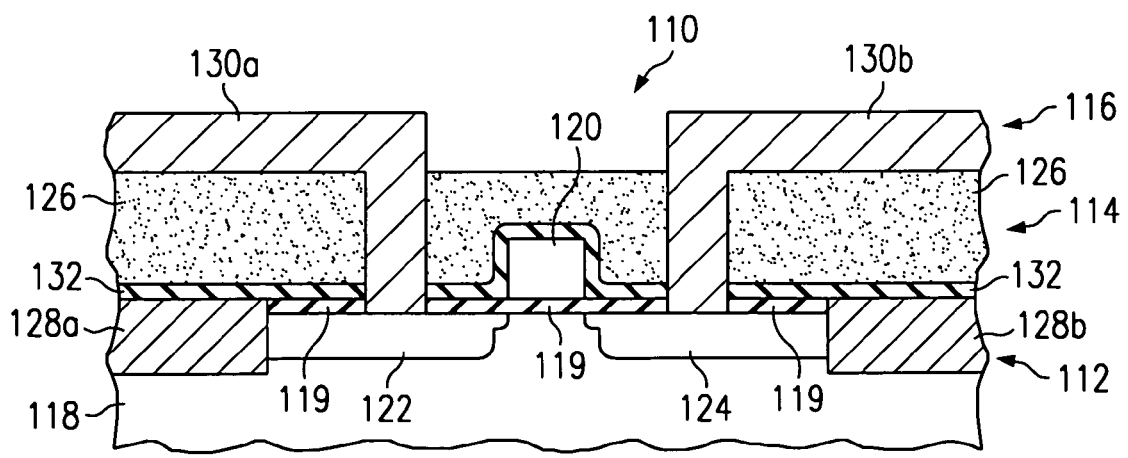

In FIG. 2i, conductive material 138 formed into contacts 130a and 130b is delineated using any suitable method, such as a pattern and etch.

Although FIGS. 2a-2i illustrate one particular example of a method of forming integrated circuit 110, integrated circuit 110 could also be formed using a wide variety of methods. For example, transistor gate 120 could be formed after the formation of source region 122 and drain region 124. Also, integrated circuit 110 may be formed without the use of insulators 128 and/or nitride layer 132.

In addition, FIGS. 2e and 2f illustrate the use of one or more doping layers 134 to dope dielectric layer 114. Other methods of forming a doped dielectric layer 114 may be used without departing from the scope of the present invention. For example, in another embodiment, an undoped dielectric layer 114 may be placed in a chamber and exposed to at least one gas containing the dopant. Applying heat and/or pressure in the chamber, dielectric layer 114 may be doped with the dopant contained in the gas.

In yet another embodiment, dielectric layer 114 could be formed in integrated circuit 110 already containing the dopant. Dielectric layer 114 could, for example, be formed using a spin-on technique, where the liquid precursor contains the dielectric material 126 and the dopant. Dielectric layer 114 could also be formed using chemical vapor deposition, where the at least one gas in the chamber contains the dopant and the constituents of the dielectric material 126. The constituents of the dielectric material 126 react to form dielectric material 126.

Although the present invention has been described in several embodiments, a myriad of changes, variations, alterations, transformations, and modifications may be suggested to one skilled in the art, and it is intended that the present invention encompass such changes, variations, alterations, transformations, and modifications as fall within the spirit and scope of the appended claims.

What is claimed is:

1. A method for forming an integrated circuit having an at least substantially doped porous dielectric, comprising:
    forming a semiconductor device comprising a transistor gate, the semiconductor device comprising at least a portion of a semiconductor substrate;
    forming a nitride layer over the semiconductor device including over the transistor gate;
    forming a dielectric layer disposed over the semiconductor substrate and nitride layer and laterally surrounding at least a portion of the transistor gate, the dielectric layer comprising an at least substantially porous dielectric material doped with at least one dopant; and
    forming a contact layer over the dielectric layer.

2. The method of claim 1, wherein the dopant comprises at least one of phosphorus, fluorine, carbon, and boron.

3. The method of claim 1, wherein the at least substantially porous dielectric material comprises an at least substantially porous oxide.

4. The method of claim 1, wherein forming a dielectric layer comprises:
    forming an undoped at least substantially porous dielectric layer over the semiconductor substrate and laterally surrounding at least a portion of the transistor gate; and
    doping the dielectric layer with the at least one dopant.

5. The method of claim 4, wherein doping the dielectric layer with the at least one dopant comprises:
    forming at least one doping layer over the dielectric layer, the at least one doping layer comprising the at least one dopant; and
    annealing the at least one doping layer and the dielectric layer.

6. The method of claim 4, wherein doping the dielectric layer comprises exposing the dielectric layer to at least one gas comprising the at least one dopant.

7. The method of claim 1, wherein forming a dielectric layer comprises depositing a liquid precursor around at least a portion of the semiconductor device, the liquid precursor comprising the dielectric material and the at least one dopant.

8. The method of claim 1, wherein forming a dielectric layer comprises forming the dielectric layer using at least one gas comprising constituents of the dielectric material and the at least one dopant.

9. The method of claim 1, wherein forming a semiconductor device comprises:
    forming a source region in the semiconductor substrate; and
    forming a drain region in the semiconductor substrate, wherein the transistor gate is located between the source region and the drain region.

10. The method of claim 9, wherein said depositing step comprises a spin-on deposition process.

11. A method for forming an integrated circuit having an at least substantially doped porous dielectric comprising:
    forming a semiconductor device comprising a transistor gate, the semiconductor device comprising at least a portion of a semiconductor substrate;
    depositing an at least substantially porous dielectric material over the semiconductor substrate and laterally surrounding at least a portion of the transistor gate;
    incorporating a dopant into the at least substantially porous dielectric material; and
    forming a contact layer over the dielectric layer;
    wherein said incorporating step comprises:
    forming at least one doping layer over the at least substantially porous dielectric material, the at least one doping layer comprising the at least one dopant; and
    annealing the at least one doping layer and the at least substantially porous dielectric material.

* * * * *